United States Patent
Nakanishi et al.

(10) Patent No.: US 12,417,691 B2
(45) Date of Patent: Sep. 16, 2025

(54) GROUND SHORT FAILURE DETECTION DEVICE AND NODE DEVICE

(71) Applicants: Isuzu Motors Limited, Kanagawa (JP); Transtron Inc., Kanagawa (JP)

(72) Inventors: Akira Nakanishi, Fujisawa (JP); Atsushi Uwabachi, Fujisawa (JP); Yasuhiro Nohara, Kanagawa (JP); Kouhei Takama, Kanagawa (JP)

(73) Assignees: Isuzu Motors Limited, Tokyo (JP); Transtron Inc., Yokohama (JP)

( * ) Notice: Subject to any disclaimer, the term of this patent is extended or adjusted under 35 U.S.C. 154(b) by 152 days.

(21) Appl. No.: 18/033,819

(22) PCT Filed: Oct. 29, 2021

(86) PCT No.: PCT/JP2021/040010
§ 371 (c)(1),
(2) Date: Apr. 26, 2023

(87) PCT Pub. No.: WO2022/092263
PCT Pub. Date: May 5, 2022

(65) Prior Publication Data
US 2024/0013648 A1 Jan. 11, 2024

(30) Foreign Application Priority Data
Oct. 30, 2020 (JP) .................................. 2020-182733

(51) Int. Cl.
*G01R 31/52* (2020.01)
*G08B 21/18* (2006.01)

(52) U.S. Cl.
CPC .......... *G08B 21/185* (2013.01); *G01R 31/52* (2020.01); *G08B 21/182* (2013.01)

(58) Field of Classification Search
CPC .... G01R 31/52; G08B 21/185; G08B 21/182; H04B 3/46
See application file for complete search history.

(56) References Cited

U.S. PATENT DOCUMENTS

| | | | |
|---|---|---|---|
| 2002/0087937 A1 | 7/2002 | Muth et al. | |
| 2010/0017661 A1* | 1/2010 | Queck ............... | H04L 12/40006 714/E11.079 |

(Continued)

FOREIGN PATENT DOCUMENTS

| | | |
|---|---|---|
| CN | 111669299 | 9/2020 |
| JP | 2002-232492 | 8/2002 |

(Continued)

*Primary Examiner* — Lee E Rodak
*Assistant Examiner* — Demetrius R Pretlow

(57) ABSTRACT

This ground short failure detection device can improve the accuracy of determining a ground short failure. The ground short failure detection device changes the potential of each of two signal lines, and transmits or receives data between a plurality of node devices. The ground short failure detection device comprises: a current measurement unit that measures a current value of a current flowing through each of the two signal lines; a determination unit that determines whether a difference between the measured current values exceeds a predetermined value, and when the difference exceeds the predetermined value, outputs a result indicating that a ground short failure occurs in a low-potential side signal line that has a relatively low potential in a dominant level among the two signal lines; and a control unit that controls the determination unit to determine whether the difference exceeds the predetermined value when a predetermined signal is completely transmitted.

6 Claims, 2 Drawing Sheets

(56) References Cited

U.S. PATENT DOCUMENTS

| | | | |
|---|---|---|---|
| 2015/0347258 A1* | 12/2015 | Du | G06F 11/3062 |
| | | | 714/4.2 |
| 2020/0160629 A1 | 5/2020 | Walker et al. | |
| 2020/0287746 A1 | 9/2020 | Kotani et al. | |
| 2022/0086023 A1* | 3/2022 | Egenhofer | H04L 12/417 |

FOREIGN PATENT DOCUMENTS

| | | |
|---|---|---|
| JP | 2006-191404 | 7/2006 |
| JP | 2020-527915 | 9/2020 |

* cited by examiner

GROUND SHORT FAILURE DETECTION DEVICE AND NODE DEVICE

TECHNICAL FIELD

The present disclosure relates to an apparatus for detecting a ground short-circuit failure (herein also simply referred to as "ground short-circuit failure detection apparatus") and node apparatus.

BACKGROUND ART

Conventionally, known as a communication network is a Controller Area Network (CAN) communication system in which signals of the CAN are transmitted by operation of voltages of two signal lines.

For example, Patent Literature (hereinafter, referred to as PTL) 1 discloses the following: a communication line including two signal lines; a node apparatus connected to the two signal lines and having a communication function; and a short-circuit failure detection apparatus including a potential measuring means for measuring the potential of each of the two signal lines, and a short-circuit failure determination means for determining whether or not a ground short-circuit failure has occurred in the communication line based on the potential measured by the potential measuring means.

CITATION LIST

Patent Literature

PTL 1
Japanese Patent Application Laid-Open No. 2006-191404

SUMMARY OF INVENTION

Technical Problem

In a CAN communication system, data transmission may be attempted simultaneously from a plurality of node apparatuses. In this case, the order of priority of the plurality of node apparatuses is determined based on identification information (ID) included in data, and communication arbitration is performed for transmitting data from a predetermined node apparatus based on the order of priority.

During the communication arbitration, currents (namely, electric current) are transmitted from the plurality of node apparatuses to two signal lines, and after the communication arbitration, a voltage is transmitted from a predetermined node apparatus to the two signal lines based on the order of priority. During the arbitration, the difference between the currents of the two signal lines may become unstable. As a result, an error may occur in the determination of the malfunction of two signal lines (CAN bus) (in this case, short-circuit failure determination), and thus the determination accuracy of the ground short-circuit failure may decrease.

In addition, for example, when a CAN communication system is mounted on a vehicle, the potential (namely, electric potential) of two signal lines may become unstable due to the difference in inductance components of the signal lines (for example, the difference in harness length) or the potential difference between two or more grounds. This may also reduce the accuracy of ground short-circuit failure determination.

An object of the present disclosure is to provide a ground short-circuit failure detection apparatus and a node apparatus capable of increasing the accuracy of ground short-circuit failure determination.

Solution to Problem

In order to achieve the above object, a ground short-circuit failure detection apparatus in the present disclosure is as follows:

a ground short-circuit failure detection apparatus in a network that includes two signal lines, changes the potential of each of the two signal lines, switches the potential difference between the two signal lines between a recessive level and a dominant level, and transmits and receives data between a plurality of node apparatuses by using the potential difference at the recessive level and the potential difference at the dominant level as signals, the ground short-circuit failure detection apparatus including:

a current measurement section that measures current values of currents flowing through the two signal lines, respectively;

a determination section that performs a determination of whether or not the difference between the current values exceeds a predetermined value, and when the difference between the current values exceeds the predetermined value, outputs a determination result indicating that a ground short-circuit failure has occurred in one signal line of the two signal lines, the one signal line being a low-potential side signal line whose potential is relatively low at the dominant level; and a control section that controls the determination section in such a way that when transmission of a predetermined signal is completed, the determination of whether or not the difference between the current values exceeds the predetermined value is performed.

In addition, a node apparatus in the present disclosure includes the above ground short-circuit failure detection apparatus.

Advantageous Effects of Invention

The present disclosure can increase the determination accuracy of a malfunction state of two signal lines (CAN bus), in this embodiment, the accuracy of ground short-circuit failure determination.

DESCRIPTION OF EMBODIMENTS

Figure 1:
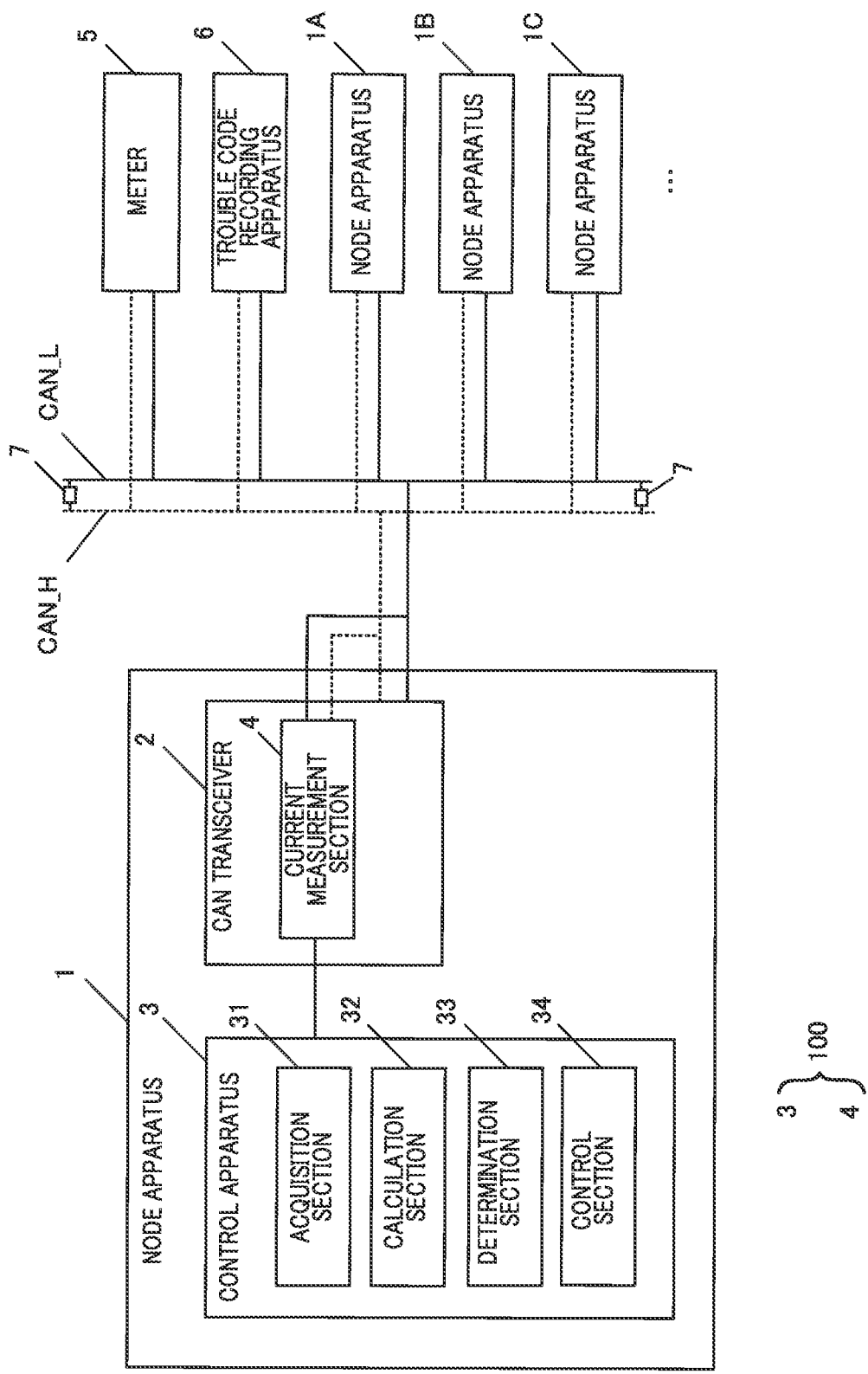
FIG. 1 illustrates an exemplary CAN bus network according to an embodiment of the present disclosure.

Hereinafter, an embodiment of the present disclosure will be described with reference to the drawings. In the present embodiment, a CAN bus network will be described as an example of an in-vehicle communication network. FIG. 1 illustrates an exemplary CAN bus network according to an embodiment of the present disclosure.

As illustrated in FIG. 1, the CAN bus network includes two signal lines. The CAN bus network is a communication network that changes the potential of each of the two signal lines, switches a potential difference between the two signal lines between a recessive level and a dominant level, and transmits and receives data between a plurality of node apparatuses by using the potential difference at the recessive level and/or the potential difference at the dominant level as a signal.

As illustrated in FIG. 1, a plurality of node apparatuses 1, 1A, 1B, and 1C are connected to the two signal lines. In addition, meter 5 such as a brake warning light and apparatus 6 for recording trouble codes (herein also simply referred to as "trouble code recording apparatus" 6) are connected to the two signal lines. When a trouble such as disconnection or short-circuit failure of the signal line or sensor malfunction occurs, the information thereof is recorded in trouble code recording apparatus 6 as a trouble code (DTC: Diagnostic Trouble Code). Terminal resistors 7 are connected to both ends of the two communication lines.

The two signal lines (also referred to as a CAN bus) include high-potential side signal line CAN_H and low-potential side signal line CAN_L. High-potential side signal line CAN_H is a signal line that has relatively low potential (for example, potential near the reference potential) at the recessive level and relatively high potential (for example, potential higher than the potential near the reference potential) at the dominant level. Low-potential side signal line CAN_L is a signal line that has relatively high potential (for example, potential near the reference potential) at the recessive level and relatively low potential (for example, potential lower than the potential near the reference potential) at the dominant level.

In the present embodiment, node apparatus 1 among the plurality of node apparatuses 1, 1A, 1B, and 1C has a function of ground short-circuit failure detection apparatus 100 for detecting a ground short circuit of low-potential side signal line CAN_L. Therefore, a description of node apparatus 1 replaces the description of ground short-circuit failure detection apparatus 100. Ground short-circuit failure detection apparatus 100 may be provided independently of node apparatus 1. Alternatively, one of the other node apparatuses 1A, 1B, and 1C may have the function of ground short-circuit failure detection apparatus 100.

Node apparatus 1 includes CAN transceiver 2 and control apparatus 3.

CAN transceiver 2 provides an interface between control apparatus 3 and physical wiring of the CAN bus. CAN transceiver 2 transmits signals through the physical wiring, thus conversion from data to differential signals and vice versa, adjustment of a differential voltage, securing of an operating voltage, protection of the wiring, and the like are performed.

CAN transceiver 2 includes current measurement section 4. Current measurement section 4 periodically measures the current value of the current flowing through high-potential side signal line CAN_H. Current measurement section 4 also periodically measures the current value of the current flowing through low-potential side signal line CAN_L. In addition, current measurement section 4 outputs each measured current value to control apparatus 3.

Control apparatus 3 is, for example, an electronic control unit (ECU) including a microcomputer including a central processing unit (CPU), a read only memory (ROM), and a random access memory (RAM), and an input/output apparatus (which are not illustrated). Control apparatus 3 achieves various functions of components such as acquisition section 31, calculation section 32, determination section 33, and control section 34, for example, by the CPU sequentially reading and executing programs stored in the ROM. Control apparatus 3, for example, processes data to be transmitted and received to/from a communication partner node apparatus (for example, one of node apparatuses 1A, 1B, and 1C) via the CAN bus (two signal lines).

Control apparatus 3 also performs other processing such as monitoring the state of the CAN bus. Control apparatus 3 thus determines whether or not the priority of another node apparatus (for example, at least one of node apparatuses 1A, 1B, and 1C) is high. When the CAN bus is in an active state (a state in which another node apparatus is transmitting data or a state immediately after completing transmission), control apparatus 3 does not process data to be transmitted and received to/from the communication partner node apparatus. Control apparatus 3 performs communication arbitration when the CAN bus is in an idle state and its own node apparatus 1 (namely, node apparatus 1 of the control apparatus itself) and another node apparatus simultaneously attempt transmission. The communication arbitration uses the identification information (ID) included in data to be transmitted by its own node apparatus 1 and the identification information (ID) included in data to be transmitted by the other node apparatus. In the communication arbitration, based on the identification information, control apparatus 3 determines the order of priority of its own node apparatus 1 and other node apparatus, and processes data to be transmitted and received to/from the communication partner node apparatus based on the order of priority.

Acquisition section 31 acquires respective current values of the two signal lines (the current values of high-potential side signal line CAN_H and low-potential side signal line CAN_L).

Calculation section 32 calculates a difference between the current values of high-potential side signal line CAN_H and low-potential side signal line CAN_L (hereinafter, referred to as "difference between (the) current values or current value difference").

Determination section 33 determines whether or not the calculated difference between the current values exceeds a predetermined value. When the difference between the current values exceeds the predetermined value, determination section 33 outputs a determination result indicating that a ground short-circuit failure has occurred in low-potential side signal line CAN_L. Specifically, when the number of times the current value difference exceeds the predetermined value exceeds a predetermined number, determination section 33 outputs the determination result indicating that a ground short-circuit failure has occurred.

Before communication arbitration, voltages are simultaneously transmitted to two signal lines from the plurality of node apparatuses. After the communication arbitration, the voltage is transmitted from a predetermined node apparatus to two signal lines based on the order of priority. As a result, when communication arbitration is performed, the potential of the two signal lines acquired by acquisition section 31 may become unstable. Therefore, the current value difference may become unstable. An error thus may occur in the determination performed by determination section 33.

In the present embodiment, the following processing is performed in determining whether or not a ground short-circuit failure has occurred in low-potential side signal line CAN_L. In the present embodiment, performing of communication arbitration is described as an exemplary case where the potential of the two signal lines becomes unstable. However, the case where the potential of two signal lines becomes unstable is not limited to communication arbitration being performed.

When communication arbitration is not performed, control section 34 controls determination section 33 in such a way that whether or not the current value difference exceeds a predetermined value is determined. When the current value difference exceeds the predetermined value, determination section 33 outputs a determination result indicating that a ground short-circuit failure has occurred in low-potential side signal line CAN_L. Control section 34 controls CAN transceiver 2 in such a way that the determination result is transmitted to trouble code recording apparatus 6.

When communication arbitration is performed, a predetermined signal is transmitted. In the present embodiment, the predetermined signal is a signal for transmitting data including identification information (ID) of its own node apparatus 1 used for the communication arbitration. Control section 34 determines whether or not the transmission of the predetermined signal is completed. The completion of the transmission of the predetermined signal means a state in which the determination can be made by using the current difference at the time when data is transmitted by its own node apparatus 1 after winning in the arbitration; and thus the determination performed by determination section 33 is less error-prone.

When the transmission of the predetermined signal is completed, control section 34 controls determination section 33 in such a way that the determination of whether or not the difference between the current values exceeds the predetermined value is performed. When the current value difference exceeds the predetermined value, determination section 33 outputs a determination result indicating that a ground short-circuit failure has occurred in low-potential side signal line CAN_L, in the manner similar to the above. Control section 34 controls CAN transceiver 2 in such a way that the determination result is transmitted to trouble code recording apparatus 6.

Figure 2:
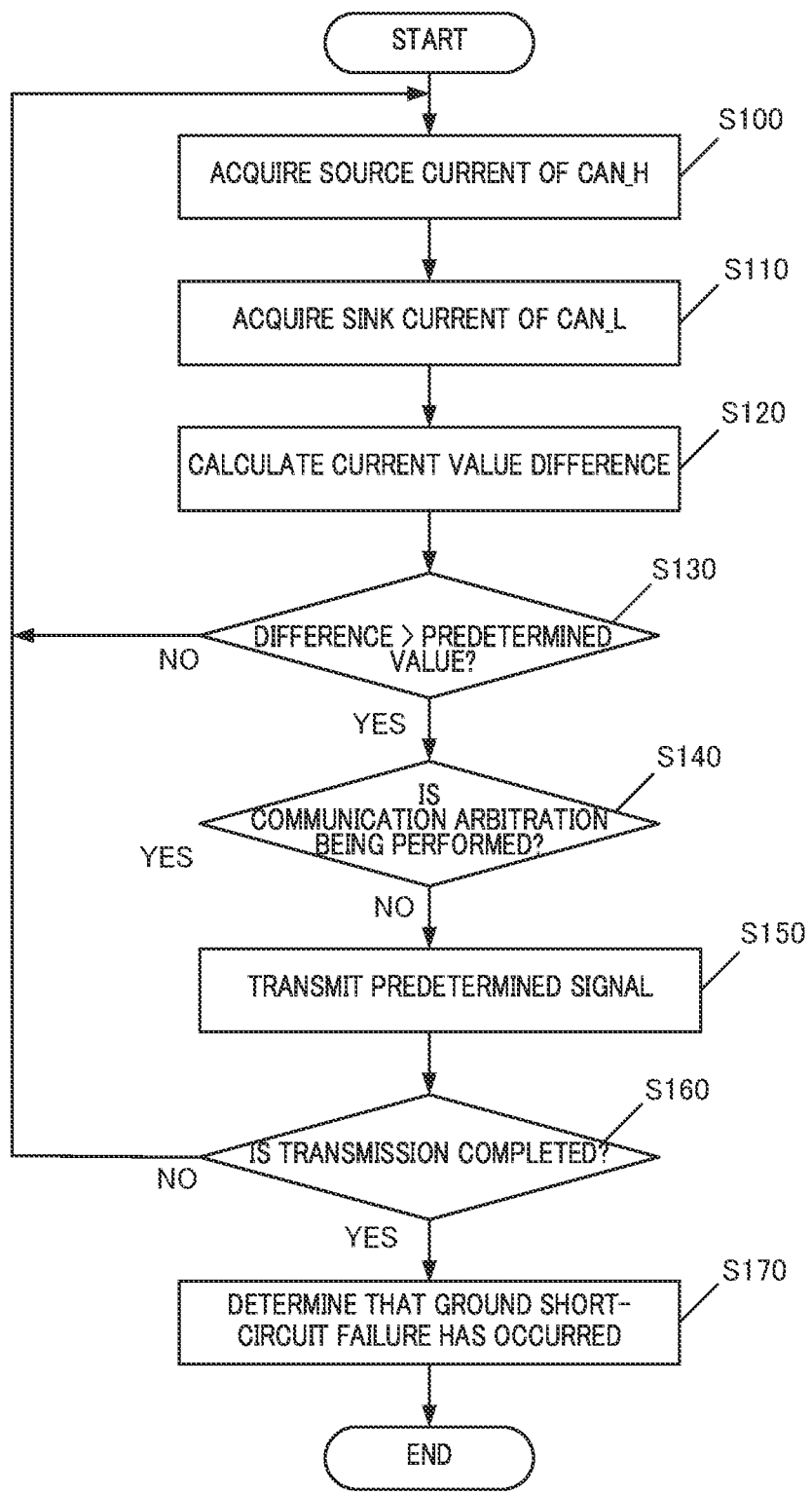
FIG. 2 is a flowchart illustrating exemplary processing by a control apparatus.

In the following, an exemplary operation will be described. FIG. 2 is a flowchart illustrating exemplary processing performed by control apparatus 3. This flow is started when the engine switch is turned on. Control apparatus 3 will be described as having the respective functions of acquisition section 31, calculation section 32, determination section 33, and control section 34. Further, transmission of a predetermined signal will be described as being performed from its own node apparatus 1.

First, in step S100, control apparatus 3 acquires the current value of the source current of high-potential side signal line CAN_H.

In step S110, control apparatus 3 then acquires the current value of the sink current of low-potential side signal line CAN_L.

In step S120, control apparatus 3 then calculates the difference between the current value of the source current of high-potential side signal line CAN_H and the current value of the sink current of the low-potential side signal line CAN_L.

In step S130, control apparatus 3 then determines whether or not the calculated difference exceeds a predetermined value. When the difference exceeds the predetermined value (step S130: YES), the processing proceeds to step S140. When the difference does not exceed the predetermined value (step S130: NO), the processing returns to before step S100.

In step S140, control apparatus 3 determines whether or not communication arbitration is being performed. When communication arbitration is being performed (step S140: YES), the processing returns to before step S100. When communication arbitration is not being performed (step S140: NO), the processing proceeds to step S150.

In step S150, control apparatus 3 controls CAN transceiver 2 in such a way that a predetermined signal is transmitted.

In step S160, control apparatus 3 then determines whether or not the transmission of the predetermined signal is completed. When transmission of the predetermined signal is completed (step S160: YES), the processing proceeds to step S170. When transmission of the predetermined signal is not completed (step S160: NO), the processing returns to before step S100.

In step S170, control apparatus 3 determines that a ground short-circuit failure has occurred in the low-potential side signal line CAN_L. Control apparatus 3 controls CAN transceiver 2 in such a way that the determination result is transmitted to trouble code recording apparatus 6.

Ground short-circuit failure detection apparatus 100 of the above embodiment is in a communication network that includes two signal lines, changes the potential of each of the two signal lines, switches the potential difference between the two signal lines between a recessive level and a dominant level, and transmits and receives data between a plurality of node apparatuses by using the potential difference at the recessive level and the potential difference at the dominant level as signals. The ground short-circuit failure detection apparatus includes: current measurement section 4 that measures the current values of the currents flowing through the two signal lines during dominant output, respectively; determination section 33 that performs a determination of whether or not the difference between the current values exceeds a predetermined value, and when the difference exceeds the predetermined value, outputs a determination result indicating that a ground short-circuit failure has occurred in one signal line of the two signal lines (the one signal line is a low-potential side signal line CAN_L whose potential is relatively high at the recessive level and relatively low at the dominant level); and control section 34 that controls determination section 33 in such a way that when transmission of a predetermined signal is completed, the determination of whether or not the difference between the current values exceeds the predetermined value is performed.

The above configuration allows the following: after transmission of the predetermined signal is completed and it is confirmed that the potential of the two signal lines is not in an unstable state, determination section 33 determines whether or not the current value difference exceeds a predetermined value, thereby reducing determination errors. This makes it possible to improve the accuracy of the ground short-circuit failure determination.

In ground short-circuit failure detection apparatus 100 of the above embodiment, control section 34 executes control to transmit a predetermined signal in a case where the potential of the two signal lines may become unstable. As a result, when the potential of the two signal lines is in an unstable state, determination section 33 does not perform determination, thereby reducing determination errors.

In addition, for ground short-circuit failure detection apparatus 100 in the above embodiment, the case where the potential of the two signal lines may become unstable is a case where communication arbitration is performed to determine the order of priority of a plurality of node apparatuses based on the identification information of at least one of the node apparatuses that is included in the data. As a result, in communication arbitration in which the potential of the two signal lines may become unstable, the determination by determination section 33 is performed after it is confirmed that the potential of the two signal lines is not in an unstable state. Therefore, it is possible to reduce errors in the determination.

In addition, for ground short-circuit failure detection apparatus 100 in the above embodiment, the predetermined signal to be transmitted when communication arbitration is performed is a signal which is used for communication arbitration, and is for transmitting data including identification information of its own node apparatus 1 (namely, node apparatus of ground short-circuit failure detection apparatus 100 itself). In this case, a predetermined signal is transmitted from its own node apparatus 1, and when the transmission of the signal is completed, ground short-circuit failure detection apparatus 100 can confirm with its own signal that the potential of the two signal lines is not in an unstable state. This case thus has an advantage such that a ground short-circuit failure can be accurately determined.

For ground short-circuit failure detection apparatus 100 in the above embodiment, performing of communication arbitration is described as an exemplary case where the potential of the two signal lines becomes unstable; however, the present disclosure is not limited thereto. For example, the following case is also possible: the potential of two signal lines becomes unstable due to the difference in the inductance components of the signal lines or the potential difference between two or more grounds. In this case, the potential of two signal lines becoming unstable may be defined as, for example, the following case: the inductance components of the two signal lines are measured, the difference between the inductance components is calculated, and the difference between the inductance components exceeds a predetermined value. In addition, the potential of two signal lines becoming unstable may also be defined as, for example, the following case: potential of two or more grounds is measured, a potential difference between the two or more grounds is calculated, and the potential difference between the two or more grounds exceeds a predetermined value.

In addition, in the description of the above embodiment, the predetermined signal to be transmitted when communication arbitration is performed is a signal which is used for the communication arbitration and is for transmitting data including identification information of its own node apparatus 1; however, the present disclosure is not limited thereto. The predetermined signal to be transmitted may be a signal which is used for the communication arbitration and is for transmitting data having a higher priority than the identification information of the plurality of node apparatuses. In this case, even when the priority of the own node apparatus 1 is not the highest among a plurality of node apparatuses related to the communication arbitration (for example, when the priority of its own identification information is lower than the priority of the identification information of other node apparatuses), the data having a higher priority can overcome the other data in the communication arbitration. Thus, a predetermined signal can be transmitted from its own node apparatus 1, and whether or not the transmission of the signal is completed can be determined without time loss. This case thus has an advantage such that whether or not a ground short-circuit failure has occurred can be periodically determined.

Each of the above-described embodiment merely shows an example of specific implementation of the present disclosure, and the technical scope of the present disclosure should not be construed to be limited thereto. That is, the present disclosure can be implemented in various forms without departing from its spirit or key features.

This application is entitled to and claims the benefit of Japanese Patent Application No. 2020-182733 filed on Oct. 30, 2020, the disclosure of which including the specification, drawings and abstract is incorporated herein by reference in its entirety.

INDUSTRIAL APPLICABILITY

The present disclosure is suitably used for a node apparatus equipped with a ground short-circuit failure detection apparatus for which an increase in the accuracy of a ground short-circuit failure determination is required.

REFERENCE SIGNS LIST 1, 1A, 1B, 1C Node apparatus
2 CAN Transceiver
3 Control apparatus
4 Current measurement section
Meter
6 Trouble code recording apparatus
7 Terminal resistor
31 Acquisition section
32 Calculation section
33 Determination section
34 Control section
100 Ground short-circuit failure detection apparatus

The invention claimed is:

1. A ground short-circuit failure detection apparatus in a communication network that includes two signal lines, changes potential of each of the two signal lines, switches a potential difference between the two signal lines between a recessive level and a dominant level, and transmits and receives data between a plurality of node apparatuses by using the potential difference at the recessive level and the potential difference at the dominant level as signals, the ground short-circuit failure detection apparatus comprising:
    a current measurement section that measures current values of currents flowing through the two signal lines, respectively;
    a determination section that performs a determination of whether or not the difference between the current values exceeds a predetermined value, and when the difference between the current values exceeds the predetermined value, outputs a determination result indicating that a ground short-circuit failure has occurred in one signal line of the two signal lines, the one signal line being a low-potential side signal line whose potential is relatively low at the dominant level; and
    a control section that controls the determination section in such a way that when transmission of a predetermined signal is completed, the determination of whether or not the difference between the current values exceeds the predetermined value is performed, wherein
    the control section executes control to transmit the predetermined signal in a case where the potential of the two signal lines becomes unstable.

2. The ground short-circuit failure detection apparatus according to claim 1, wherein
    the case where the potential of the two signal lines becomes unstable is a case where communication arbitration is performed to determine an order of priority of the plurality of node apparatuses based on identification information of at least one of the plurality of node apparatuses, the identification information being included in the data.

3. The ground short-circuit failure detection apparatus according to claim 2, wherein
the predetermined signal is a signal which is used for the communication arbitration and is for transmitting the data including the identification information of the node apparatus of the ground short-circuit failure detection apparatus itself.

4. The ground short-circuit failure detection apparatus according to claim 2, wherein
the predetermined signal is a signal which is used for the communication arbitration and is for transmitting data having a higher priority than the identification information of any of the plurality of node apparatuses.

5. The ground short-circuit failure detection apparatus according to claim 1, wherein
the predetermined signal is a signal indicating identification information of at least one of the plurality of node apparatuses.

6. A node apparatus comprising the ground short-circuit failure detection apparatus according to claim 1.

* * * * *